US008426951B2

(12) United States Patent
Han

(10) Patent No.: US 8,426,951 B2
(45) Date of Patent: Apr. 23, 2013

(54) MULTI-CHIP PACKAGE HAVING FRAME INTERPOSER

(75) Inventor: Kyu-Jin Han, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 264 days.

(21) Appl. No.: 12/959,596

(22) Filed: Dec. 3, 2010

(65) Prior Publication Data
US 2011/0180916 A1    Jul. 28, 2011

(30) Foreign Application Priority Data
Jan. 28, 2010 (KR) ........................ 10-2010-0007981

(51) Int. Cl.
*H01L 23/495*  (2006.01)
*H01L 23/02*  (2006.01)

(52) U.S. Cl.
USPC ............................ 257/666; 257/667; 257/686

(58) Field of Classification Search .................. 257/666, 257/667, 686
See application file for complete search history.

(56) References Cited

U.S. PATENT DOCUMENTS

| | | | | |
|---|---|---|---|---|
| 5,545,922 A * | 8/1996 | Golwalkar et al. | ........... | 257/676 |
| 5,585,668 A * | 12/1996 | Burns | ........................... | 257/676 |
| 7,002,239 B1 * | 2/2006 | Nadarajah et al. | ............ | 257/666 |
| 7,663,246 B2 * | 2/2010 | Chen et al. | ..................... | 257/777 |
| 7,745,932 B2 * | 6/2010 | Ko et al. | ......................... | 257/735 |
| 2004/0251557 A1 * | 12/2004 | Kee | ................................ | 257/777 |
| 2006/0006508 A1 * | 1/2006 | Mitsuhashi | .................... | 257/676 |
| 2006/0166405 A1 * | 7/2006 | Ichikawa | ....................... | 438/109 |
| 2007/0164406 A1 * | 7/2007 | Tseng | ............................. | 257/666 |
| 2008/0061411 A1 * | 3/2008 | Shen et al. | ..................... | 257/670 |
| 2008/0251899 A1 * | 10/2008 | Urushihata | .................... | 257/670 |
| 2009/0146271 A1 * | 6/2009 | Chin et al. | ..................... | 257/666 |
| 2010/0035381 A1 * | 2/2010 | Yoshimura et al. | ........... | 438/109 |

FOREIGN PATENT DOCUMENTS

| | | |
|---|---|---|
| JP | 2000-124395 | 4/2000 |
| JP | 2002-124623 | 4/2002 |
| KR | 10-2009-0060148 | 6/2009 |

* cited by examiner

*Primary Examiner* — James Mitchell
(74) *Attorney, Agent, or Firm* — Harness, Dickey & Pierce, P.L.C.

(57) ABSTRACT

A multi-chip package is provided. The multi-chip package may include a frame interposer, a first chip stack with n number of semiconductor chips on a first surface of the frame interposer, and a second chip stack with m number of semiconductor chips on a second surface of the frame interposer. The interposer may have first and second openings. The first chip stack may extend over one of the first and second openings and may expose the other of the first and second openings. The second chip stack may extend over the other of the first and second openings and may expose the one of the first and second openings.

19 Claims, 5 Drawing Sheets

MULTI-CHIP PACKAGE HAVING FRAME INTERPOSER

CROSS-REFERENCE TO RELATED APPLICATION

This application claims priority under 35 U.S.C. §119 to Korean Patent Application No. 10-2010-7981 filed on Jan. 28, 2010, in the Korean Intellectual Property Office (KIPO), the entire contents of which is herein incorporated by reference.

BACKGROUND

1. Field

Example embodiments relate to a semiconductor device, and more particularly, to a multi-chip package having a frame interposer and a method of fabricating the same.

2. Description of Related Art

As semiconductor devices have become lighter, thinner, and more compact, technology to realize a multi-chip package has been studied in various ways. The multi-chip package includes a plurality of chips, which are in electrical contact with each other in one package. Generally, the structure of the multi-chip package is vulnerable to defects such as warpage produced by manufacturing processes.

SUMMARY

Example embodiments provide a multi-chip package which can be efficiently mass-produced, and a method of fabricating the same.

In accordance with example embodiments, a multi-chip package may include a frame interposer, a first chip stack, and a second chip stack. The interposer may have a first surface and a second surface which face each other and may have a first opening and a second opening. The first chip stack may be on the first surface and may have n number of semiconductor chips. The first chip stack may include a first semiconductor chip adjacent to the first surface and the first semiconductor chip may extend over one of the first and second openings and may expose the other of the first and second openings. The second chip stack may be on the second surface and may have m number of semiconductor chips. The second chip stack may include a second semiconductor chip adjacent to the second surface and the second semiconductor chip may extend over the other of the first and second openings and may expose the one of the first and second openings. In example embodiments, n and m are positive integers.

In accordance with example embodiments, a multi-chip package may include a frame interposer, a first chip stack, and a second chip stack. The frame interposer may include a first surface and a second surface which face each other. The first chip stack may be attached to the first surface and may include n number of semiconductor chips. The second chip stack may be attached to the second surface and may include m number of semiconductor chips. Here, n and m are positive integers.

In example embodiments, the frame interposer, and the first and second chip stacks may be covered with an encapsulant. The encapsulant may have a first thickness on the first surface and a second thickness on the second surface. The first and second thicknesses may be substantially the same. The frame interposer may have substantially the same width as the encapsulant.

In example embodiments, an external contact terminal in electrical contact with the first chip stack through the encapsulant may be provided. The first chip stack may include a first semiconductor chip adjacent to the frame interposer and an $n^{th}$ semiconductor chip formed on the first semiconductor chip and disposed the farthest away from the frame interposer. In example embodiments, the external contact terminal may be provided on the $n^{th}$ semiconductor chip.

In example embodiments, a redistribution pad formed between the $n^{th}$ semiconductor chip and the external contact terminal may be provided. The external contact terminal may be in electrical contact with the first and second chip stacks via the redistribution pad. The external contact terminal may be one selected from the group consisting of a solder ball, a conductive bump, a lead grid array (LGA), a pin grid array (PGA), and a combination thereof.

In example embodiments, the frame interposer may be one selected from the group consisting of an etched copper lead frame, a stamped copper lead frame, an etched alloy 42 lead frame, a stamped alloy 42 lead frame, and a combination thereof.

In example embodiments, the frame interposer may include a plurality of frame leads and a frame pad spaced apart from the frame leads. The frame pad may include a first sub-pad, a second sub-pad, and a main pad formed between the first and second sub-pads. A first opening formed between the main pad and the first sub-pad, and a second opening formed between the main pad and the second sub-pad may be provided.

In example embodiments, the frame leads may include a first frame lead and a second frame lead. The frame lead may be provided between the first frame lead and the second frame lead.

In example embodiments, an encapsulant covering the first and second chip stacks and filling the first and second openings may be included. The encapsulant may include a resin and a filler. The first and second openings may be larger than the filler. The filler may be larger than a thickness of the first semiconductor chip.

In example embodiments, the first chip stack may include a first semiconductor chip attached to the first sub-pad and the main pad, and a second semiconductor chip attached onto the first semiconductor chip. The second semiconductor chip may partially overlap the first semiconductor chip. The part of the semiconductor chip may be arranged in the second opening.

In example embodiments, the second chip stack may include a first semiconductor chip attached to the second sub-pad and the main pad, and a second semiconductor chip attached onto the first semiconductor chip. The semiconductor chip may partially overlap the first semiconductor chip. The part of the second semiconductor chip may be arranged in the first opening.

In example embodiments, the first and second chip stacks may include a cascade stack, an overhang stack, or a combination of the overhang stack and the cascade stack.

In example embodiments, a control chip may be attached to the frame interposer.

In example embodiments, an electronic system may include an input/output device, and a multi-chip package formed adjacent to and in electrical contact with the input/output device. The multi-chip package may include a frame interposer, a first chip stack, and a second chip stack. The frame interposer may include a first surface and a second surface which face each other. The first chip stack may be attached to the first surface and may include n number of semiconductor chips. The second chip stack may be attached to the second surface and m number of semiconductor chips.

Here, n and m are positive integers.

In example embodiments, the first and second chip stacks may include one selected from a dynamic random access memory (DRAM), a static random access memory (SRAM), a flash memory, a phase change memory, a magnetic random access memory (MRAM), a resistive random access memory (RRAM), and a combination thereof.

In example embodiments, an encapsulant covering the frame interposer, and the first and second chip stacks may be provided. An external contact terminal in electrical contact with the first chip stack through the encapsulant may be provided. The external contact terminal may be in electrical contact with the first and second chip stacks. The frame interposer may have substantially the same width as the encapsulant.

In example embodiments, a controller adjacent to and in electrical contact with the input/output device may be provided. The controller may be in electrical contact with the multi-chip package.

BRIEF DESCRIPTION OF THE DRAWINGS

The foregoing and other features and advantages of example embodiments will be apparent from the more particular descriptions illustrated in the accompanying drawings in which like reference characters refer to the same parts throughout the different views. The drawings are not necessarily to scale, emphasis instead being placed upon illustrating the principles of example embodiments. In the drawings.

DETAILED DESCRIPTION OF EXAMPLE EMBODIMENTS

Figure 1:
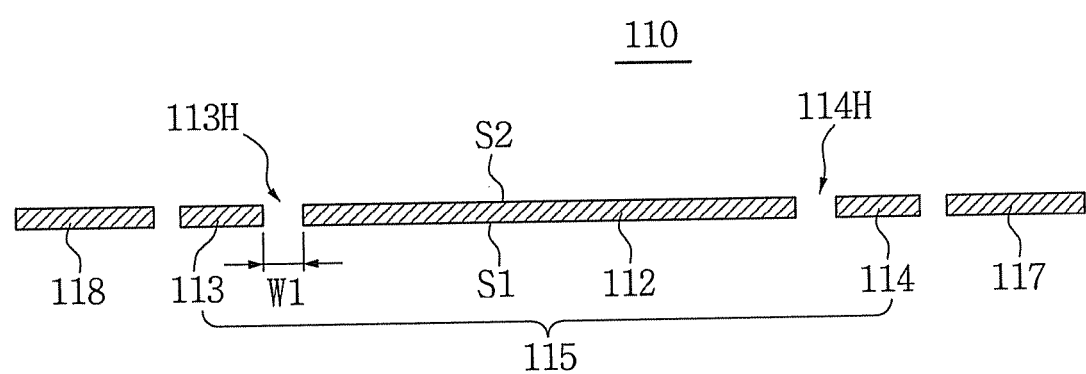
FIGS. 1 through 3 are cross-sectional views illustrating a multi-chip package and a method of fabricating the same according to example embodiments.

Example embodiments will now be described more fully with reference to the accompanying drawings. Example embodiments may, however, be embodied in different forms and should not be construed as limited to the embodiments set forth herein. Rather, example embodiments are provided so that this disclosure is thorough and complete and fully conveys the inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures). As such, variations from the shapes of the illustrations as a result, for example; of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
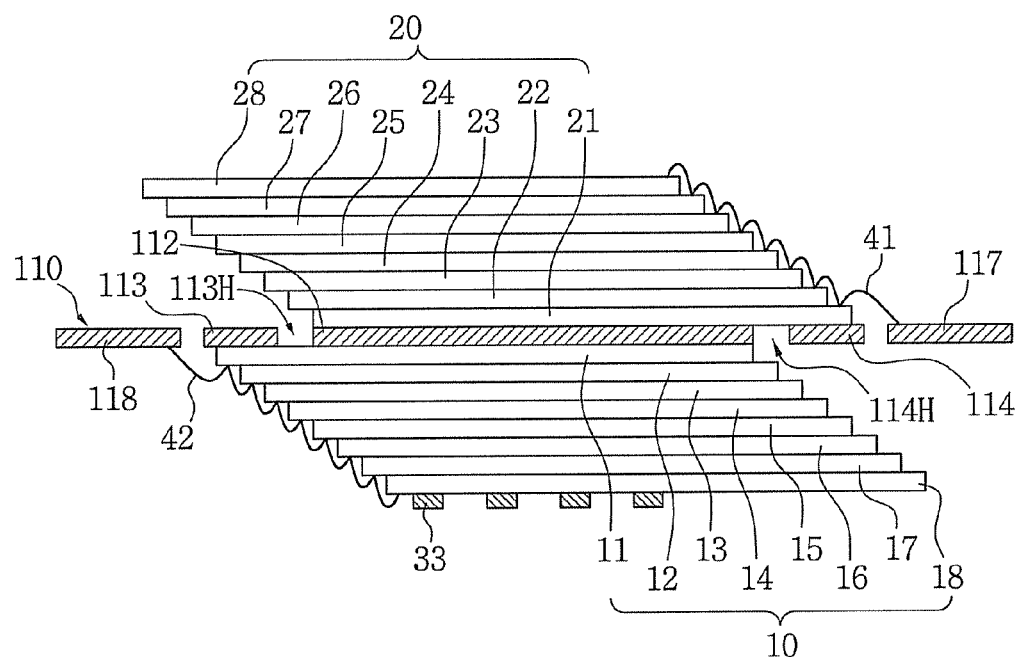
Figure 3:
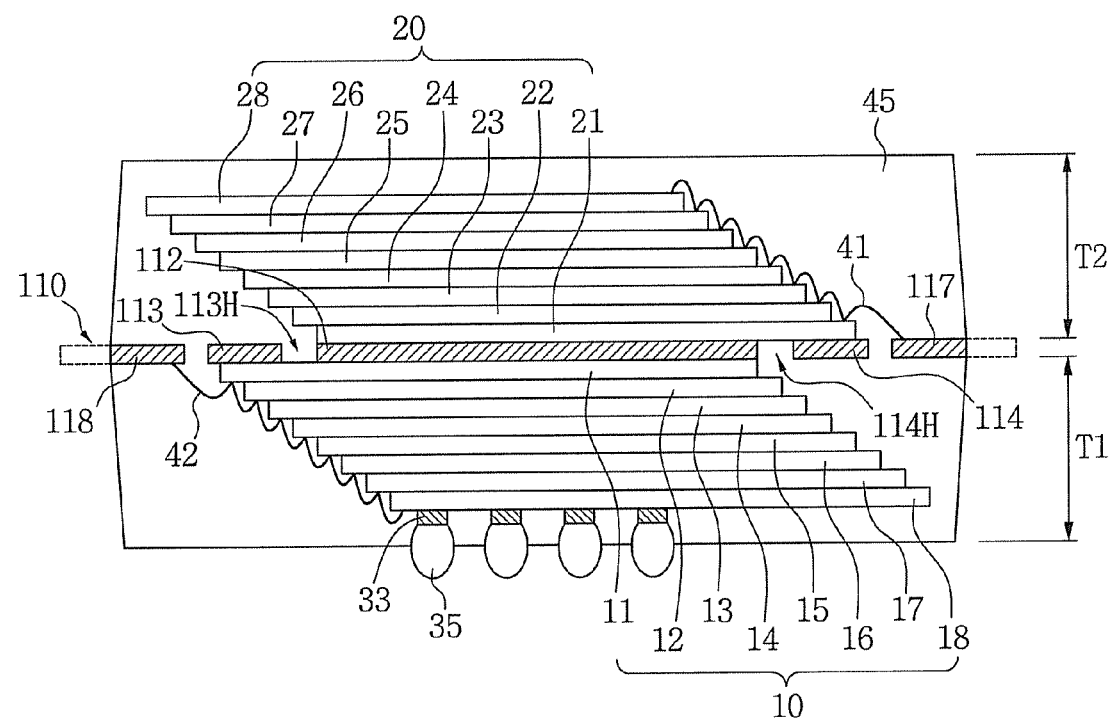

FIGS. 1 through 3 are cross-sectional views illustrating a multi-chip package and a method of fabricating the same according to example embodiments.

Referring to FIG. 1, a frame interposer 110 having a frame pad 115 and frame leads 117 and 118 may be prepared. The frame pad 115 may include a main pad 112 and sub-pads 113 and 114. The frame interposer 110 may define a first surface Si and a second surface S2 which face each other. The frame interposer 110 may be formed of one selected from the group comprising an etched copper lead frame, a stamped copper lead frame, an etched alloy 42 lead frame, a stamped alloy 42 lead frame, and a combination thereof.

The main pad 112 may be provided between a first sub-pad 113 and a second sub-pad 114. Openings 113H and 114H having a first width W1 may be formed between the main pad 112 and the sub-pads 113 and 114. The openings 113H and 114H may be a first opening 113H and a second opening 114H. Each of the sub-pads 113 and 114 may extend to be in contact with the main pad 112. Several main pads 112 may be arranged in parallel. The frame pad 115 may be provided between a first frame lead 117 and a second frame lead 118. Each of the frame leads 117 and 118 may be spaced apart from the frame pad 115. The first and second frame leads 117 and 118 may be in electrical contact with each other via a detour interconnection (not shown).

Figure 7:
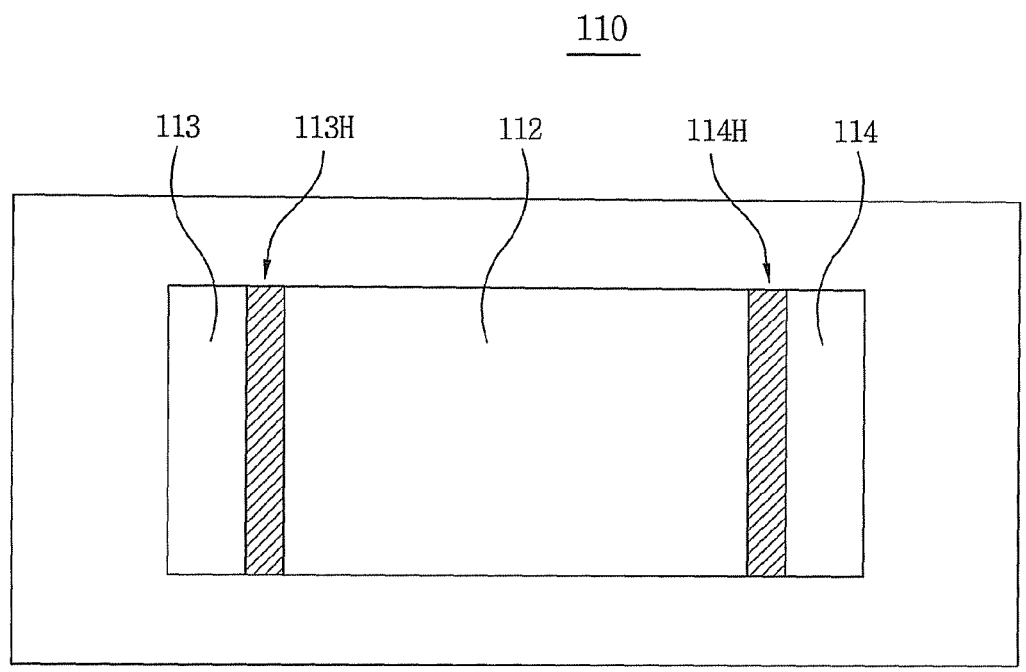
FIG. 7 is a plan view of a frame interposer according to example embodiments.
Figure 8:
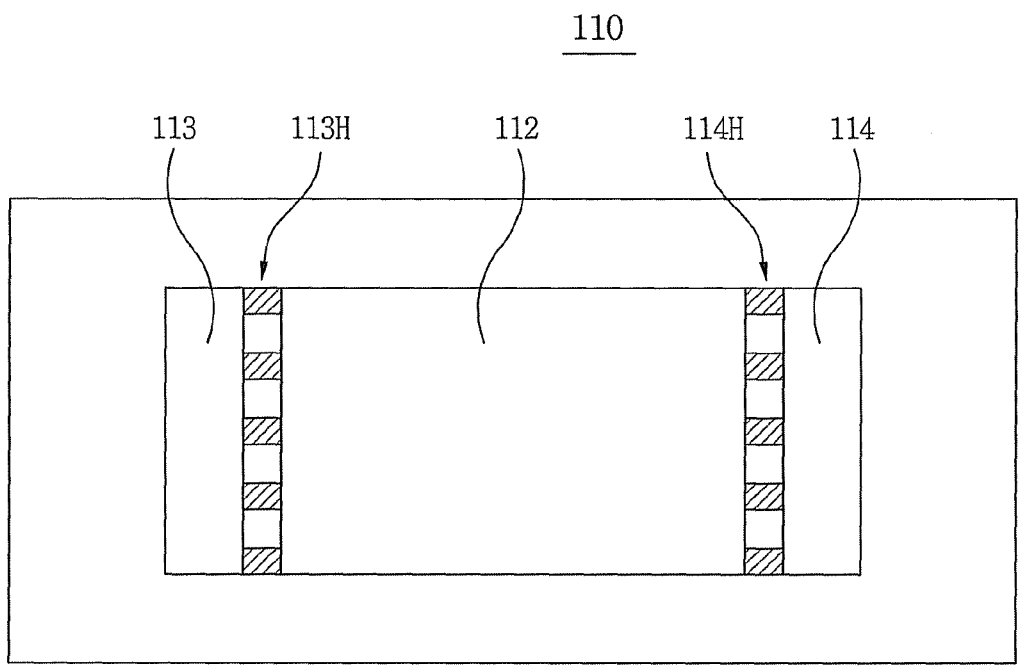
FIG. 8 is a plan view of a frame interposer according to example embodiments.

In example embodiments, the first and second openings 113H and 114H may be rectangular shaped openings that may be about the length of a semiconductor chip that may be mounted on the main pad 112 (for example, semiconductor chip 11 or 21 illustrated in FIG. 2). FIG. 7, for example, is a plan view showing a fame interposer 110 according to example embodiments. In FIG. 7, the first and second openings 113H and 114H are illustrated as rectangular strips having a length substantially the same as the main pad 112 which may be about as long as a semiconductor chip that may be mounted thereon, however, example embodiments are not limited thereto. For example, FIG. 8 shows a frame interposer 110 having the openings 113H and 114H as a plurality of openings spaced along the sides of a main pad 112. In FIGS. 7 and 8 the first and second frame leads 117 and 118 are not shown for the sake of simplicity.

The frame interposer 110 may be formed as a symmetrical structure based on the center of the main pad 112. The frame interposer 110 may be easily manufactured in various shapes, and may have relatively excellent mechanical strength, a relatively uniform thickness, and a relatively low electrical resistance.

Referring to FIG. 2, a first chip stack 10 may be attached to the first surface S1 of the frame interposer 110, and a second chip stack 20 may be attached to the second surface S2 of the frame interposer 110. The second chip stack 20 may be in electrical contact with the first frame lead 117 using a first internal interconnection 41, and the first chip stack 10 may be in electrical contact with the second frame lead 118 using a second internal interconnection 42. The first chip stack 10 may include n number of semiconductor chips 11 to 18, and the second chip stack 20 may include m number of semiconductor chips 21 to 28. Here, n and m are positive integers, may be multiples of 2, and may be equal to each other, however, example embodiments are not limited thereto.

For example, the first chip stack 10 may include first to eighth semiconductor chips 11 to 18, and the second chip stack 20 may include ninth to sixteenth semiconductor chips 21 to 28. The first through sixteenth semiconductor chips 11 to 18 and 21 to 28 may include a volatile memory chip (for example, a dynamic random access memory (DRAM) or a static random access memory (SRAM)), a non-volatile memory chip (for example, a flash memory, a phase change memory, a magnetic random access memory (MRAM)), or a resistive random access memory (RRAM), or a combination thereof The first semiconductor chip 11 may be attached to the first surface Si of the frame interposer 110. In example embodiments, the first semiconductor chip 11 may overlap the main pad 112 and the first sub-pad 113. An adhesive may be interposed between the first semiconductor chip 11 and the frame interposer 110, but a description thereof will be omitted for brevity.

The second to eighth semiconductor chips 12 to 18 may be sequentially attached onto a surface of the first semiconductor chip 11. As shown in FIG. 2, the first to eighth semiconductor chips 11 to 18 may be arranged as a cascade stack. In example embodiments, the second semiconductor chip 12 may partially overlap the first semiconductor chip 11. In other words, a part of the second semiconductor chip 12 may not overlap the first semiconductor chip 11. The part of the semiconductor chip 12 that does not overlap the first semiconductor chip 11 may overlap the second opening 114H. For example, the second opening 114H may be arranged above a part of the second semiconductor chip 12.

The first to eighth semiconductor chips 11 to 18 may be in electrical contact with the second frame lead 118 via the second internal interconnection 42. Redistribution pads 33 may be formed on a surface of the first chip stack 10. The redistribution pads 33 may be formed on an $n^{th}$ chip in the first chip stack 10. For example, the redistribution pads 33 may be formed on the eighth semiconductor chip 18. That is, the redistribution pads 33 may be formed on the outermost chip in the first chip stack 10. The redistribution pads 33 may be formed of a metal layer, for example, a copper (Cu), an aluminum (Al), and/or a tungsten (W) layer. The first to eighth semiconductor chips 11 to 18 may be in electrical contact with the redistribution pads 33 via the second internal interconnection 42.

The ninth semiconductor chip 21 may be attached to the second surface S2 of the frame interposer 110. In example embodiments, the ninth semiconductor chip 21 may overlap the main pad 112 and the second sub-pad 114. An adhesive may also be interposed between the ninth semiconductor chip 21 and the frame interposer 110, but a description thereof will be omitted for brevity.

The tenth to sixteenth semiconductor chips 22 to 28 may be sequentially attached onto a surface of the ninth semiconductor chip 21. As shown in FIG. 2, the ninth to sixteenth semiconductor chips 21 to 28 may be arranged as a cascade stack. In example embodiments, the tenth semiconductor chip 22 may partially overlap the ninth semiconductor chip 21. In other words, a part of the tenth semiconductor chip 22 may not overlap the ninth semiconductor chip 21. The part of the tenth semiconductor chip 22 that does not overlap the ninth semiconductor chip 21 may overlap the first opening 113H. That is, the first opening 113H may be arranged above a part of the tenth semiconductor chip 22.

The ninth to sixteenth semiconductor chips 21 to 28 may be in electrical contact with the first frame lead 117 via the first internal interconnection 41. The first and second internal interconnections 41 and 42 may be formed using a wire bonding technique, a beam lead bonding technique, a tape bonding technique, and a combination thereof, however, example embodiments are not limited thereto. The first and second internal interconnections 41 and 42 may be one selected from the group comprising a gold wire, an aluminum wire, a beam lead, a conductive tape, and a combination thereof. In example embodiments, the ninth to sixteenth semiconductor chips 21 to 28 may be in electrical contact with the redistribution pads 33 via the first internal interconnection 41, the first frame lead 117, the second frame lead 118, and the second internal interconnection 42. The first and second chip stacks 10 and 20 may have a point-symmetrical structure based on the center of the frame interposer 110.

In example embodiments, the first and second chip stacks 10 and 20 may include an overhang stack, or a combination of an overhang stack and a cascade stack.

Referring to FIG. 3, an encapsulant 45 covering the first and second chip stacks 10 and 20 may be formed. External contact terminals 35 in contact with the redistribution pads 33 through the encapsulant 45 may be formed. The external contact terminals 35 may be solder balls, however, example embodiments are not limited thereto, for example the external contact terminals could be studs. The frame leads 117 and 118 may be partially removed using a trimming process. That is, the frame interposer 110 may have substantially the same width as the encapsulant 45. As a result, a multi-chip package including the frame interposer 110, the first chip stack 10, the second chip stack 20, the internal interconnections 41 and 42, the redistribution pads 33, the encapsulant 45, and the external contact terminals 35 may be completed.

The encapsulant 45 may be an epoxy molding compound (EMC) including a resin and a filler. The filler may be a spherical filler having a size of 55 to 125 μm. The encapsulant 45 may be formed to a first thickness T1 on the first surface S1, and to a second thickness T2 on the second surface S2. The first and second thicknesses T1 and T2 may be substantially the same.

As described above, the second opening 114H may be arranged in a part of the interposer 110 above the second chip 12, and the first opening 113H may be arranged in a part of the interposer 110 below the tenth semiconductor chip 22. That is, the first opening 113H may be interposed between the tenth semiconductor chip 22 and the first semiconductor chip 11, and the second opening 114H may be interposed between the second semiconductor chip 12 and the ninth semiconductor chip 21. The first and second openings 113H and 114H may have a first width (W1 of FIG. 1). The first width (W1 of FIG. 1) may be greater than the filler.

The first and second openings 113H and 114H may be filled with the encapsulant 45. Due to the first and second openings 113H and 114H, the encapsulant 45 may have an excellent filling characteristic. According to example embodiments, the filler may be relatively larger than the conventional one. For example, the filler may be thicker than the first semiconductor chip 11. An epoxy molding compound (EMC) including a relatively large filler may be relatively less expensive and may have excellent reliability. In other words, a multi-chip package which is not expensive and has excellent reliability may be realized.

The external contact terminal 35 may be formed using a laser drilling technique. In example embodiments, the external contact terminal 35 may be one selected from the group comprising a conductive bump, a lead grid array (LGA), a pin grid array (PGA), and a combination thereof. The external contact terminal 35 may be in electrical contact with the first and second chip stacks 10 and 20.

As described above, the frame interposer 110 may be formed as a symmetrical structure based on the center of the main pad 112. In addition, the first and second chip stacks 10 and 20 may have a point symmetrical structure based on the center of the main interposer 110. The first and second thicknesses T1 and T2 may be substantially the same. Furthermore, the frame interposer 110 may have relatively excellent mechanical strength. As a result, the multi-chip package according to example embodiments may significantly overcome a defect resulting from a manufacturing process such as warpage.

Figure 4:
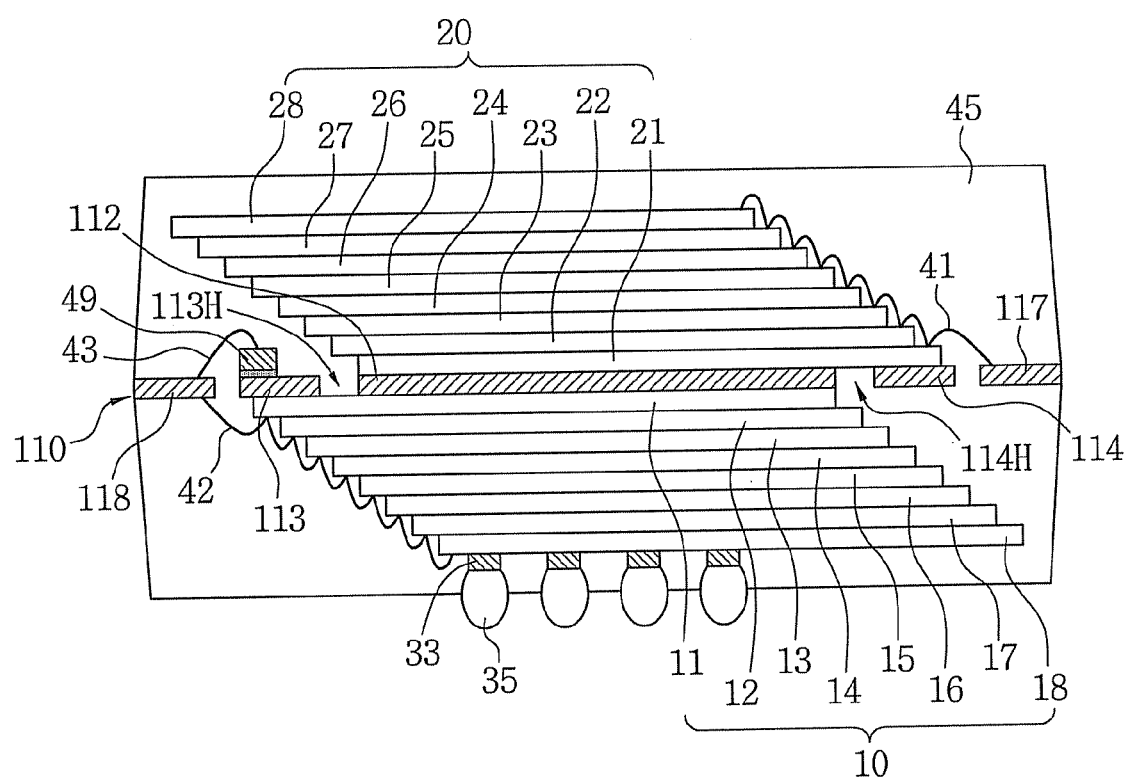
FIG. 4 is a cross-sectional view illustrating a multi-chip package and a method of fabricating the same according to example embodiments.

FIG. 4 is a cross-sectional view illustrating a multi-chip package and a method of fabricating the same according to example embodiments.

Referring to FIG. 4, a multi-chip package according to example embodiments may include a frame interposer 110, a first chip stack 10, a second chip stack 20, internal interconnections 41, 42 and 43, redistribution pads 33, an encapsulant 45, external contact terminals 35, and a control chip 49. Only a difference from example multi-chip package illustrated in FIGS. 1-3 from the example multi-chip package illustrated in FIG. 4 will be briefly described below.

The control chip 49 may be mounted on a side of the frame interposer 110. For example, the control chip 49 may be attached onto a first sub-pad 113. The control chip 49 may be in electrical contact with a second frame lead 118 through a third internal interconnection 43. The internal interconnections 41, 42 and 43 may be formed using a wire bonding technique, a beam lead bonding technique, a tape bonding technique, and/or a combination thereof. The internal interconnections 41, 42 and 43 may be one selected from the group comprising a gold wire, an aluminum wire, a beam lead, a conductive tape, and/or a combination thereof.

Although example embodiments illustrate the control chip 49 being mounted on an upper surface of the first sub pad 113, example embodiments are not limited thereto. For example, the control chip 49 could be mounted on a lower surface of the second sub pad 114.

Figure 5:
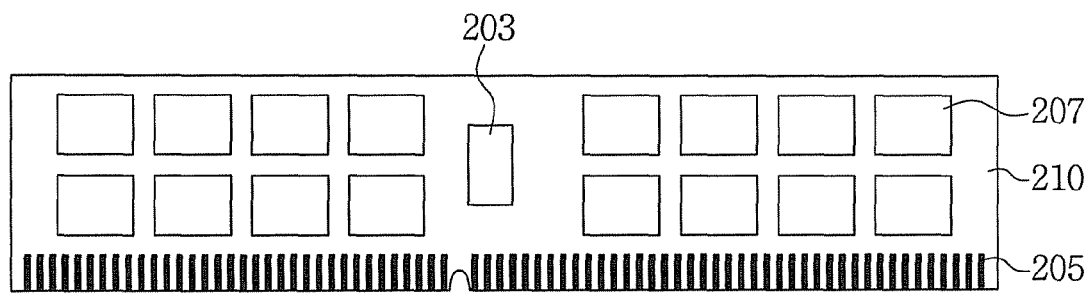
FIG. 5 is a plan view of a semiconductor module employing a multi-chip package according to example embodiments.

FIG. 5 is a plan view of a semiconductor module employing a multi-chip package according to example embodiments.

Referring to FIG. 5, a semiconductor module according to example embodiments may include a module substrate 210, a plurality of multi-chip packages 207, and a control chip package 203. Input/output terminals 205 may be formed in the module substrate 210. The multi-chip packages 207 may be similar to those described with reference to FIGS. 1 through 4.

The multi-chip packages 207 and the control-chip package 203 may be mounted on the module substrate 210. The multi-chip packages 207 and the control chip package 203 may be in electrical contact with the input/output terminals 205 in series or parallel. In example embodiments, the control chip package 203 may be omitted.

The multi-chip packages 207 may include a volatile memory chip, for example, a DRAM or an SRAM, a non-volatile memory chip, for example, a flash memory, a phase change memory, an MRAM or an RRAM, or a combination thereof. In example embodiments, the semiconductor module according to example embodiments may be a memory module.

Figure 6:
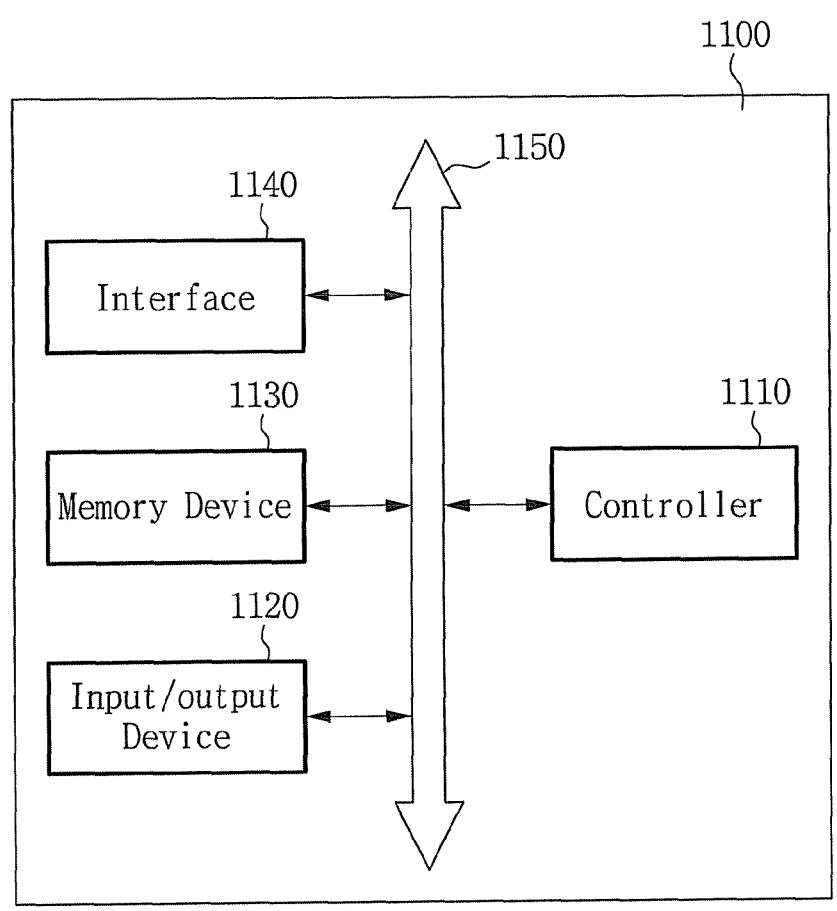
FIG. 6 is a diagram of an electronic system employing a multi-chip package according to example embodiments.

FIG. 6 is a diagram of an electronic system employing a multi-chip package according to example embodiments. Referring to FIG. 6, an electronic system 1100 according to example embodiments may include a controller 1110, an input/output device 1120, a memory device 1130, an interface 1140, and a bus structure 1150. The memory device 1130 may include a multi-chip package similar to example embodiments illustrated in FIGS. 1 through 4. The bus structure 1150 may provide a pathway transferring data between the controller 1110, the input/output device 1120, the memory device 1130, and the interface 1140.

The controller 1110 may include at least one microprocessor, a digital signal processor, a microcontroller, and at least one of logic devices performing similar functions thereto.

The input/output device 1120 may include at least one selected from a key pad, a key board, and a display device. The memory device 1130 may serve to store data and/or a command executed by the controller 1110.

The memory device 1130 may include a volatile memory chip, for example, a DRAM or an SRAM, a non-volatile memory chip, for example, a flash memory, a phase change memory, an MRAM or an RRAM, or a combination thereof. For example, the electronic system 1100 may be a solid-state disk (SSD).

The interface 1140 may serve to send data to a communication network or receive data from a communication network. The interface 1140 may be a wired/wireless type. For example, the interface 1140 may include an antenna or a wired/wireless transceiver. An application chipset, a camera image processor (CIS), and an input/output device may be further provided to the electronic system 1100.

The electronic system 1100 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music system, and a data transceiver system. When the electronic system 1100 is a device capable of performing wireless communication, the electronic system 1100 may be used for a communication system such as code division multiple access (CDMA), global system for mobile communication (GSM), North American digital cellular (NADC), enhanced-time division multiple access (E-TDMA), wideband code division multiple access (WCDMA), or CDMA2000.

According to example embodiments, a multi-chip package having a frame interposer is provided. A first chip stack and a second chip stack may be attached to the frame interposer. The frame interposer and the first and second chip stacks may be covered with an encapsulant. The frame interposer may be relatively less expensive and may have relatively excellent mechanical strength and relatively high reliability. As a result, a multi-chip package having high mass-production efficiency may be realized.

The foregoing is illustrative of example embodiments and is not to be construed as limiting thereof. Although example embodiments have been described, those skilled in the art will readily appreciate that many modifications are possible in example embodiments without materially departing from the novel teachings and advantages. Accordingly, all such modifications are intended to be included within the scope of the inventive concepts as defined in the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other embodiments, are intended to be included within the scope of the appended claims.

What is claimed is:

1. A multi-chip package, comprising:
   a frame interposer having a first surface and a second surface which face each other, the frame interposer having a first opening and a second opening;
   a first chip stack on the first surface and having n number of semiconductor chips, the first chip stack including a first semiconductor chip adjacent to the first surface, the first semiconductor chip extending over one of the first and second openings and exposing the other of the first and second openings; and
   a second chip stack on the second surface and having m number of semiconductor chips, the second chip stack including a second semiconductor chip adjacent to the second surface, the second semiconductor chip extending over the other of the first and second openings and exposing the one of the first and second openings,
   wherein n and m are positive integers, and
   wherein the frame interposer includes
      a plurality of frame leads, and
      a frame pad spaced apart from the plurality of frame leads, the frame pad including a first sub-pad, a second sub-pad, and a main pad between the first and second sub-pads, the first opening being between the main pad and the first sub-pad, and the second opening being between the main pad and the second sub-pad.

2. The multi-chip package according to claim 1, further comprising:
   an encapsulant covering the frame interposer and the first and second chip stacks.

3. The multi-chip package according to claim 2, wherein the encapsulant has a first thickness on the first surface and a second thickness on the second surface, the first and second thicknesses being substantially the same.

4. The multi-chip package according to claim 2, wherein the frame interposer has substantially the same width as the encapsulant.

5. The multi-chip package according to claim 2, further comprising:
   an external contact terminal in electrical contact with the first chip stack through the encapsulant,
   wherein the first chip stack includes an $n^{th}$ semiconductor chip on the first semiconductor chip and disposed farthest away from the frame interposer, the external contact terminal being formed on the $n^{th}$ semiconductor chip.

6. The multi-chip package according to claim 5, further comprising:
   a redistribution pad between the $n^{th}$ semiconductor chip and the external contact terminal,
   wherein the external contact terminal is in electrical contact with the first and second chip stacks via the redistribution pad.

7. The multi-chip package according to claim 5, wherein the external contact terminal is one of a solder ball, a conductive bump, a lead grid array (LGA), a pin grid array (PGA), and a combination thereof.

8. The multi-chip package according to claim 1, wherein the frame interposer includes one of an etched copper lead frame, a stamped copper lead frame, an etched alloy 42 lead frame, a stamped alloy 42 lead frame, and a combination thereof.

9. The multi-chip package according to claim 1, wherein the plurality of frame leads include a first frame lead and a second frame lead, and the frame pad is between the first and second frame leads.

10. The multi-chip package according to claim 1, further comprising:
    an encapsulant covering the frame interposer and the first and second chip stacks, and filling the first and second openings, wherein the encapsulant includes a resin and a filler, and the first and second openings are larger than the filler.

11. The multi-chip package according to claim 10, wherein the first chip stack further includes a third semiconductor chip, and the first semiconductor chip is attached to the first sub-pad and the main pad, and the third semiconductor chip is on the first semiconductor chip, wherein the third semiconductor chip partially overlaps the first semiconductor chip, and a part of the third semiconductor chip is arranged below the second opening.

12. The multi-chip package according to claim 11, wherein the filler is thicker than the first semiconductor chip.

13. The multi-chip package according to claim 10, wherein the second chip stack includes a fourth semiconductor chip, and the second semiconductor chip is attached to the second sub-pad and the main pad, and the fourth semiconductor chip is on the second semiconductor chip, wherein the fourth semiconductor chip partially overlaps the second semiconductor chip, and a part of the fourth semiconductor chip is arranged above the first opening.

14. The multi-chip package according to claim 1, wherein the first and second chip stacks comprise one of a cascade stack, an overhang stack, and a combination of the overhang stack and the cascade stack.

15. The multi-chip package according to claim 1, further comprising:
a control chip on the frame interposer.

16. An electronic system, comprising:
an input/output device; and
the multi-chip package of claim 1 arranged adjacent to and in electrical contact with the input/output device.

17. The electronic system according to claim 16, wherein the first and second chip stacks include at least one of a dynamic random access memory (DRAM), a static random access memory (SRAM), a flash memory, a phase change memory, a magnetic random access memory (MRAM), a resistive random access memory (RRAM), and a combination thereof.

18. The electronic system according to claim 16, further comprising:
an encapsulant covering the frame interposer, and the first and second chip stacks; and
an external contact terminal in electrical contact with the first chip stack through the encapsulant,
wherein the external contact terminal is in electrical contact with the first and second chip stacks.

19. The electronic system according to claim 18, wherein the frame interposer has substantially the same width as the encapsulant.

* * * * *